United States Patent [19]
Pezzini et al.

[11] Patent Number: 6,124,821
[45] Date of Patent: Sep. 26, 2000

[54] CAPACITIVE ARRAY HAVING A CORRECT CAPACITIVE RATIO AMONG THE COMPONENT CAPACITORS, PARTICULARLY FOR CONVERTERS

[75] Inventors: Saverio Pezzini, Vimercate; Paolo Brasca, Milan, both of Italy

[73] Assignee: SGS-Thomson Microelectronics, S.r.l., Agrate Brianza, Italy

[21] Appl. No.: 09/119,901

[22] Filed: Jul. 21, 1998

[30] Foreign Application Priority Data

Jul. 25, 1997 [IT] Italy .................................. MI97A1781

[51] Int. Cl.[7] ...................................................... H03M 1/38
[52] U.S. Cl. ............................ 341/161; 341/172; 341/133
[58] Field of Search ..................................... 341/161, 172, 341/133

[56] References Cited

U.S. PATENT DOCUMENTS

| | | | |
|---|---|---|---|
| 5,099,239 | 3/1992 | Bruce et al. | 341/155 |
| 5,322,438 | 6/1994 | McNutt et al. | 437/61 |
| 5,952,952 | 9/1999 | Choi et al. | 341/172 |
| 5,966,047 | 10/1999 | Anderson et al. | 327/365 |
| 5,973,633 | 10/1999 | Hester | 341/172 |
| 6,016,019 | 1/2000 | Wojewoda | 307/109 |

*Primary Examiner*—Brian Young
*Assistant Examiner*—Jason L W Kost
*Attorney, Agent, or Firm*—Jenkens & Gilchrist, P.C.; Theodore E. Galantha

[57] ABSTRACT

A capacitive array particularly for converters, comprising a plurality of unitary capacitors, the number of the unitary capacitors being equal to $2^n$, where n is the number of bits of the binary code required in output, the unitary capacitors being mutually connectable so as to obtain capacitors in which the capacitance ratio between one capacitor and the adjacent parallel-connected capacitor is equal to a factor of two. The invention is that the factor-of-two capacitance ratio of adjacent capacitors is achieved by mutually diagonally connecting in parallel the unitary-capacitance capacitors of the capacitive array in a preset number according to the capacitance value to be obtained.

17 Claims, 2 Drawing Sheets

6,124,821

CAPACITIVE ARRAY HAVING A CORRECT CAPACITIVE RATIO AMONG THE COMPONENT CAPACITORS, PARTICULARLY FOR CONVERTERS

FIELD OF THE INVENTION

The present invention relates to a capacitive array having a correct capacitive ratio among the component capacitors. More particularly, the invention relates to a particular capacitive array which is suitable for use, for example, in successive-approximation analog/digital ("A/D") converters with charge redistribution.

BACKGROUND OF THE INVENTION

In conventional analog/digital converters having a successive-approximation architecture of the charge-redistribution type, providing a network of capacitors requires the implementation of an array of capacitors. The number of capacitors in the array depends on the number of bits used to express the digital code in output from the successive-approximation converter. In particular, the capacitive array is implemented for the digital/analog converter that is present in the A/D successive-approximation converter. The capacitive values of the various capacitors must be such that one is twice the other. The structure that is generally used is the common-centroid type.

The value of the capacitance between a capacitor associated with one bit and the capacitor associated with the adjacent bit must be scaled precisely by a factor of 2 in order to achieve good binary encoding in output. The capacitor array, however, entails problems due to parasitic effects which are inevitably linked to capacitive couplings among the various layers by means of which the capacitors are formed. In particular, parasitic effects occur due to capacitive coupling between the edges of the facing plates of the capacitor. If these parasitic capacitances are not compensated by a particular structure of the array, said capacitances can have a negative effect because they vary the value of the ratio among the capacitive values.

In practice, the parasitic capacitances cause the ratio between a capacitor and the adjacent one to be other than a factor of 2. The ratio in fact increases due to the addition of an offset arising from the parasitic capacitance. This leads to a change in the width of the conversion channel and therefore to an altered binary code in output. Providing the capacitors of the array by means of a parallel connection of unitary capacitors solves this problem of parasitic capacitance altering the ratio.

The parasitic capacitive effects are also present as capacitive edge effects between the perimetric edge of a capacitor and the capacitors that are adjacent thereto. These last capacitive effects cause the ratio between one capacitor and the adjacent one in the above-described capacitive array to be other than the intended ratio of 2, because these parasitic capacitances cannot be compensated by conventional array structures.

FIG. 3 illustrates a conventional capacitor array in which the thicker lines represent the connections between the capacitors 1A which are parallel-connected and the reference numerals 10 designate the parasitic capacitances caused by capacitive edge couplings among adjacent capacitors. The figure shows that the capacitor 1A in the bottom left region of the illustrated mini-array has three parasitic capacitances 10, one for each free side, while the capacitor 1A which is adjacent thereto in an upward region instead has two parasitic edge capacitances 10 and therefore a capacitive imbalance is present.

SUMMARY OF THE INVENTION

The aim of the present invention is to provide a capacitive array, particularly for analog/digital successive-approximation charge-redistribution converters, wherein the parasitic edge capacitances of the capacitors composing the capacitive array are compensated.

Within the scope of this aim, an object of the present invention is to provide a capacitive array, particularly for analog/digital converters, which maintains a correct capacitive ratio between the capacitors composing the array.

Another object of the present invention is to provide a capacitive array particularly for analog/digital converters in which the parasitic effects are equally distributed to each capacitor composing the array.

Another object of the present invention is to provide a capacitive array particularly for analog/digital converters which achieves a gain in the linearity of the converter.

Another object of the present invention is to provide a capacitive array particularly for analog/digital converters which is highly reliable and relatively easy to provide at low costs.

This aim, these objects and others which will become apparent hereinafter are achieved by a capacitive array particularly for converters, comprising a plurality of unitary capacitors, the number of said unitary capacitors being equal to $2^n$, where n is the number of bits of the binary code required in output, said unitary capacitors being mutually connectable so as to obtain capacitors in which the capacitance ratio between one capacitor and the adjacent parallel-connected capacitor is equal to a factor of two. The factor-of-two capacitance ratio of adjacent capacitors is achieved by mutually connecting in parallel, with a diagonal connection, said unitary-capacitance capacitors of said capacitive array, in a preset number according to the capacitance value to be obtained.

BRIEF DESCRIPTION OF THE DRAWINGS

In all the figures, identical elements are designated by identical reference numerals.

DETAILED DESCRIPTION OF A PREFERRED EMBODIMENT OF THE INVENTION

The capacitor array according to the present invention is illustrated with reference to FIGS. 1 and 2. Said figures illustrate, by way of example, a capacitive array used in the case of eight-bit converters in which the effects of the parasitic capacitances are equally distributed to each capacitor.

Figure 1:
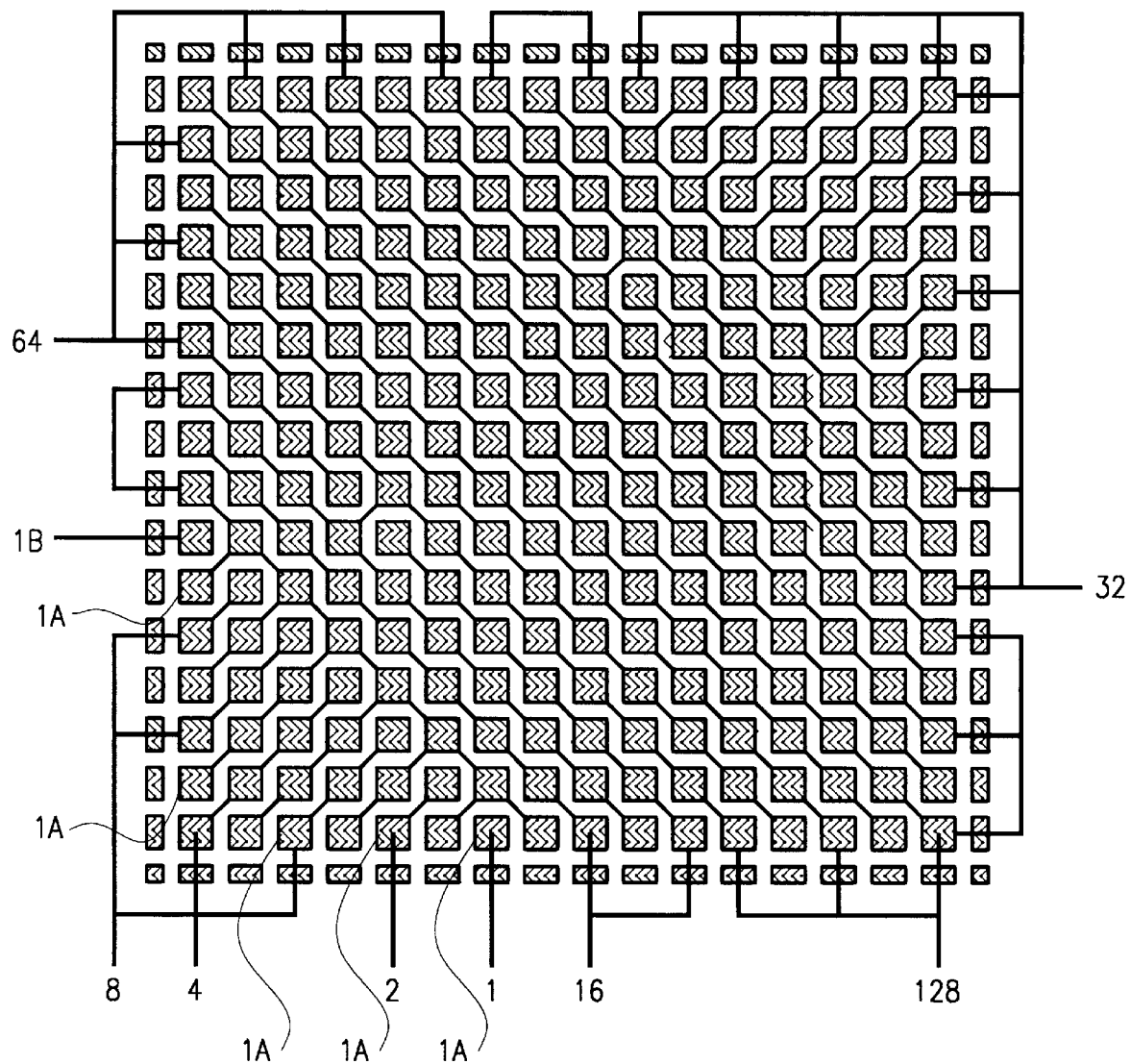
FIG. 1 is a schematic view of a capacitive array according to the present invention.

In detail, considering a unitary capacitor 1A, whose value is represented by 1 in FIG. 1, all the other capacitors of the converter are obtained by connecting in parallel N unitary capacitors 1A of the array, where N is an even whole number.

In the case of eight bits, if $C_0$ is the capacitance of the unitary capacitor 1A, the capacitor that is adjacent thereto and is parallel-connected has a capacitance $2C_0$ and the following one has a capacitance $4C_0$, up to the eighth capacitor, which has a capacitance equal to $128C_0$ (i.e., $2^7C_0$).

Figure 2:
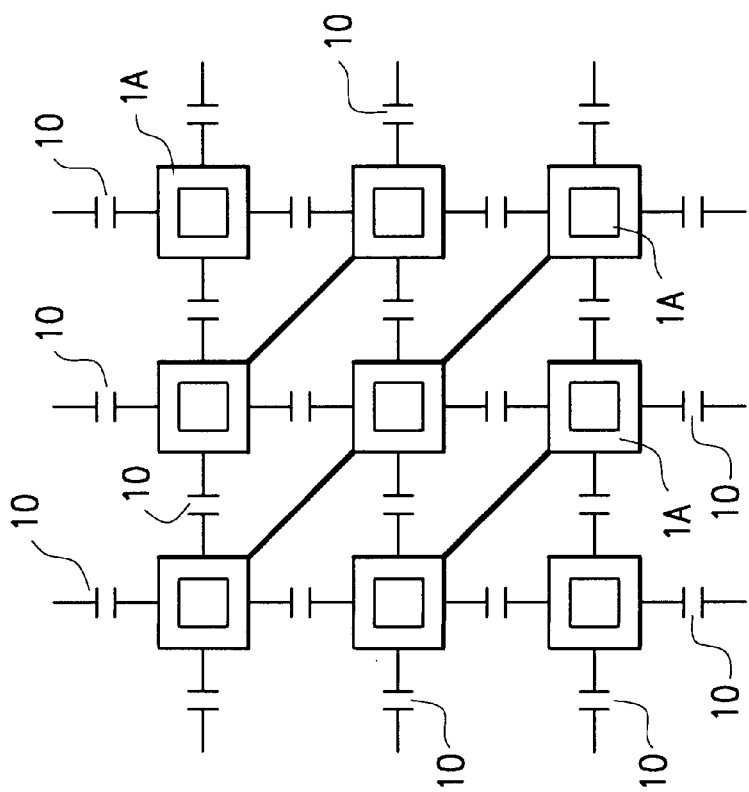
FIG. 2 is a schematic detail view of a portion of a capacitive array according to the present invention.

FIG. 2 illustrates in detail a portion of the capacitive array with parallel-connected capacitors 1A. In this manner, the parasitic capacitances 10 maintain mutual proportionality because the same structure is always repeated. FIG. 1 and even more clearly FIG. 2 show that each individual capacitor 1A has, on all four sides, an identical parasitic capacitance 10 because it sees an identical structure in every direction.

This fact is allowed by the mutual diagonal connection of the capacitors 1A. In contrast to the conventional connection, shown in FIG. 3, said diagonal connection maintains the parasitic capacitances of each capacitor 1A and therefore avoids creating undesirable capacitive imbalances and a consequent uneven charge redistribution among the various parallel-connected capacitors.

In detail, the total capacitance $C_{tot}$ of the capacitor array according to the invention is given by $$C_{tot} = N \cdot Ca \cdot A + M \cdot Cf \cdot P$$

where N is the number of capacitors connected in parallel to each other, Ca is the value of the capacitance caused by the capacitive coupling among the plates of the capacitors, A is the area of the capacitor, M is ¼ for each side of the unitary capacitor that is adjacent to another capacitor related to a different bit (due to capacitive couplings between adjacent capacitors), Cf is the value of the parasitic edge capacitance per unit length and P is the perimeter of the capacitor.

In order to provide an equal distribution of charge on the individual capacitors and therefore to meet the ratio, according to a factor of two, between the mutually parallel-connected capacitors, N must be equal to M. That is, the number of capacitors must be equal to the number of parasitic capacitances seen as a whole by said capacitors. This occurs in the case of the capacitive array according to the invention, which is illustrated in its entirety in FIG. 1 and in detail in FIG. 2 and in which a diagonal connection among the individual capacitors is provided.

Figure 3:
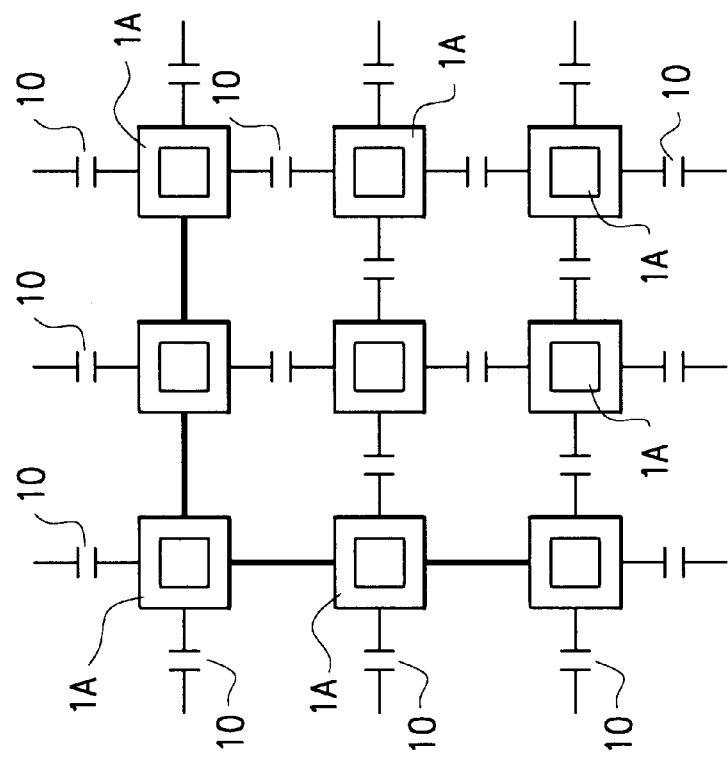
FIG. 3 is a schematic detail view of a portion of a capacitive array according to the prior art.

On the contrary, this does not occur in conventional capacitive array, shown in FIG. 3, in which the number N of capacitors is greater than the number M of parasitic capacitances they see (the connection among the capacitors in this case is not provided diagonally as shown in FIG. 2 and therefore the parasitic capacitances lying between one capacitor and the one connected to it are short-circuited) and an equal charge distribution on the individual capacitors is not possible.

Returning to FIG. 1, it is observed that the reference numeral 2 designates a capacitor which has a capacitance $2C_0$ and is obtained by mutually diagonally connecting two unitary capacitors 1A; likewise, the reference numeral 4 designates a capacitor which has a capacitance $4C_0$ and is obtained by mutually diagonally connecting four unitary capacitors 1A, and so forth, up to the reference numeral 128, which designates a capacitor whose charge is equal to $128C_0$ and which is obtained by diagonally connecting 128 unitary capacitors 1A.

The capacitive array also shows another unitary capacitor 1B, which is required for a converter having said architecture and whose value is equal to the value of the unitary capacitor, designated by the reference numeral 1 (capacitance $C_0$).

The thicker lines around the perimeter of the capacitive array, with portions that point directly to respective unitary capacitors 1A, designate the unitary capacitors whereto successive unitary capacitors are diagonally connected in order to obtain a capacitor whose total capacitance is indicated by the reference numeral located outside the thicker portion. In this manner, the parasitic capacitances 10 are perfectly balanced and the charge is equally distributed to each unitary capacitor. Therefore, the ratio according to a factor of 2 between the parallel-connected capacitors is maintained.

The capacitive array according to the invention can be used for example in analog/digital (A/D) converters of the successive-approximation charge-redistribution type, in which the array acts as DAC (Digital Analog Converter) inside the A/D converter.

Another application of the capacitive array according to the invention can also be found in D/A converters.

The capacitive array according to the invention acts as sample and hold circuit besides acting as a converter. In this manner, an additional sample and hold circuit is avoided.

In practice, the capacitive array according to the invention can be used in all those applications requiring an equal charge redistribution on all capacitors, with balancing of the inevitable parasitic capacitances involved.

In practice, it has been observed that the capacitive array according to the invention fully achieves the intended aim, since it allows to have a charge which is equally distributed to all the capacitors of the array, with a consequent optimum balancing of the parasitic capacitances and which, if used in a successive-approximation charge-redistribution A/D converter, produces a gain in the precision of the converter, i.e., an increase in the linearity thereof.

The capacitive array thus conceived is susceptible of numerous modifications and variations, all of which are within the scope of the inventive concept; all the details may also be replaced with other technically equivalent elements.

In practice, the materials employed, so long as they are compatible with the specific use, as well as the dimensions, may be any according to requirements and to the state of the art.

We claim:

1. A capacitive array particularly for use in a converter, comprising a plurality of unitary capacitors, the number of said unitary capacitors being equal to $2^n$, where n is the number of bits of a binary code associated with the converter, said unitary capacitors being mutually connectable so as to obtain capacitors in which the capacitance ratio between one capacitor and an adjacent capacitor is equal to a factor of two, wherein said factor-of-two capacitance ratio of adjacent capacitors is achieved by mutually connecting in parallel, with a diagonal connection, said unitary-capacitance capacitors of said capacitive array.

2. The capacitive array according to claim 1, wherein the converter is an analog/digital converter of the successive-approximation charge-redistribution type.

3. The capactitive array according to claim 2, wherein said capacitive array is used in the digital/analog converter of said successive-approximation charge-redistribution analog/digital converter.

4. The capacitive array according to claim 1, wherein the diagonal connection of said unitary capacitors maintains, for each one of said unitary capacitors, the same value of the parasitic edge capacitances caused by capacitive couplings with adjacent unitary capacitors.

5. The capacitive array according to claim 1, wherein the converter is a digital/analog converter.

6. The capacitive device of claim 1, wherein:
   for each capacitor cell in the array, the parasitic capacitance associated with each immediately adjacent capacitor cell is substantially the same.

7. The capacitor device of claim 1, wherein:
   each capacitor cell is formed from a pair of parallel plates; and the capacitance of each pair of parallel plates has substantially the same capacitance.

8. A capacitive device, comprising:

a plurality of rows of identically sized capacitor cells, the rows of capacitor cells being arranged relative to each other to form an array of capacitor cells;

the array of capacitor cells including a plurality of groups of capacitor cells wherein for each group, the capacitor cells within that group are electrically connected together in parallel; and a parasitic capacitance associated with each capacitor cell in the array is substantially the same.

9. The capacitive device of claim 8, wherein:

for each group, each capacitor cell in that group is disposed diagonally in the array relative to at least one other capacitor cell within the same group and connected thereto so as to form a chain of diagonally-connected capacitor cells.

10. The capacitive device of claim 9, wherein:

a chain of diagonally-connected capacitor cells in one group of capacitor cells is immediately adjacent at least one chain of diagonally-connected capacitor cells in another group of capacitor cells.

11. The capacitive device of claim 9, wherein:

each chain of diagonally-connected capacitor cells is immediately adjacent at least one chain of diagonally-connected capacitor cells from another group of capacitor cells.

12. The capacitive device of claim 8, wherein:

for each capacitor cell in the array, capacitor cells immediately adjacent thereto in a row or column comprise capacitor cells from other groups of capacitor cells.

13. A capacitive device, comprising:

an array of capacitor cells organized into a plurality of rows and columns of capacitor cells, each capacitor cell formed from a pair of parallel plates providing substantially the same capacitance, the array including a plurality of groups of capacitor cells;

capacitor cells in at least one group of capacitor cells in the array are electrically connected to each other in parallel; and for each capacitor cell in the array, a parasitic capacitance associated with each immediately adjacent capacitor cell along a corresponding row and column is substantially the same.

14. The capacitive device of claim 13, wherein:

for each group, each capacitor cell in that group is electrically connected in parallel to the other capacitor cells in that group and disposed diagonally relative to at least one other capacitor cell in that group so as to form a chain of diagonally-disposed capacitor cells.

15. The capacitive device of claim 14, wherein:

a chain of diagonally-disposed capacitor cells in one group of capacitor cells is immediately adjacent at least one chain of diagonally-disposed capacitor cells in another group of capacitor cells.

16. The capacitive device of claim 14, wherein:

each chain of diagonally-disposed capacitor cells is immediately adjacent at least one chain of diagonally-disposed capacitor cells from another group of capacitor cells.

17. The capacitive device of claim 13, wherein:

for each capacitor cell, capacitor cells immediately adjacent thereto along a row and column in the array comprise capacitor cells in other groups of capacitor cells.

* * * * *